US009080255B2

(12) United States Patent
Yang et al.

(10) Patent No.: US 9,080,255 B2
(45) Date of Patent: Jul. 14, 2015

(54) METHOD OF PRODUCING SILVER NANOWIRES IN LARGE QUANTITIES

(75) Inventors: Cheng Yang, Hong Kong (CN); Matthew Ming Fai Yuen, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 9 days.

(21) Appl. No.: 13/435,983

(22) Filed: Mar. 30, 2012

(65) Prior Publication Data
US 2012/0247275 A1 Oct. 4, 2012

Related U.S. Application Data

(60) Provisional application No. 61/457,453, filed on Mar. 31, 2011.

(51) Int. Cl.
| | | |
|---|---|---|
| B22F 9/24 | (2006.01) | |
| C22C 5/06 | (2006.01) | |
| C30B 29/60 | (2006.01) | |
| B82Y 30/00 | (2011.01) | |
| B82Y 40/00 | (2011.01) | |
| C30B 7/02 | (2006.01) | |
| C30B 29/02 | (2006.01) | |

(52) U.S. Cl.
CPC . *C30B 29/60* (2013.01); *B22F 9/24* (2013.01); *B82Y 30/00* (2013.01); *B82Y 40/00* (2013.01); *C30B 7/02* (2013.01); *C30B 29/02* (2013.01); *B22F 2998/00* (2013.01); *B22F 2999/00* (2013.01)

(58) Field of Classification Search
CPC .... B22F 9/24; B22F 2301/255; B22F 1/0018; Y10S 977/762; B65B 3/04; B65B 5/00
USPC ............................................. 75/370
See application file for complete search history.

(56) References Cited

U.S. PATENT DOCUMENTS

2009/0196788 A1* 8/2009 Wang et al. .................. 420/501
2010/0148132 A1* 6/2010 Jiang et al. ................... 252/514

FOREIGN PATENT DOCUMENTS

CN 1843670 A 10/2006

OTHER PUBLICATIONS

Tang et al. Rapid and high-yield synthesis of silver nanowires using air-assisted polyol method with chloride ions, Colloids and Surfaces A: Physicochemical and Engineering Aspects, 2009, vol. 338, p. 33-39.*
Silvert et al. Preparation of colloidal silver dispersions by the polyol process. Part 1-Synthesis and characterization. J. Mater. Chem. 1996, vol. 6, p. 573-577.*

(Continued)

*Primary Examiner* — Jie Yang
*Assistant Examiner* — Xiaowei Su
(74) *Attorney, Agent, or Firm* — Nath, Goldberg & Meyer; Jerald L. Meyer; Stanley N. Protigal

(57) ABSTRACT

Monodispersed silver nanowires are formed by a process utilizing a polyol. A capping agent is mixed in the polyol to form a substantially homogeneous solution. The solution is heated to a level below a boiling point of the polyol. The solution is diluted with a diluent which may consist of water and/or alcohol, and the solution is centrifuged to produce the silver nanowires.

18 Claims, 5 Drawing Sheets

(56) References Cited

OTHER PUBLICATIONS http://www.diytrade.com/china/pd/7809642/Ethylene_Glycol_MEG.html. Dec 23, 2010.* http://www.oxiteno.com.br/cms/media/26056/diethylene_glycol_co_eng.pdf, Aug. 2011.* http://c1-preview.prosites.com/37030/wy/docs/Glycerin%20Purification.pdf, 2013.*

Wiley et al. Acc. Chem. Res. 2007, 40, 1067-1076.*

Murphy, Catherine J., et al., "Surfactant-Directed Synthesis and Optical Properties of One-Dimensional Plasmonic Metallic Nanostructures", MRS Bulletin vol. 30 (May 2005), available at: www.mrs.org/publications/bulletin.

Cepak, Veronica M., et al., "Preperation of Polymeric Micro- and Nanostructures Using a Template-Based Deposition Method", Chem. Mater. vol. 11, No. 5, pp. 1363-1367, American Chem'l Soct'y (Apr. 17, 1999).

Sapp, Shawn A., et al., "Using Template-Synthesized Micro- and Nanowires as Building Blocks for Self-Assembly of Supramolecular Architectures", Chem. Mater. vol. 11, No. 5, pp. 1183-1185, American Chem'l Soct'y (Apr. 15, 1999).

Edmondson, Michael J., et al., "Electron Beam-Induced Growth of Bare Silver Nanowires from Zeolite Crystallites" Adv. Mater. vol. 13, No. 21, pp. 1608-1611, Wiley-VCH Verlag GmBH (Nov. 2, 2001).

Han, Yong-Jin, et al., "Preparation of Noble Metal Nanowires Using Hexagonal Mesoporous Silica SBA-15", Chem. Mater. vol. 12, No. 8, pp. 2068-2069, American Chem'l Soct'y (Jul. 6, 2000).

Huang, Michael H., et al., "Ag Nanowire Formation within Mesoporous Silica", Chem. Commun. 2000, pp. 1063-1064, The Royal Soc'ty of Chemst'y (2000).

Iijima, Sumio, et al., "Single-shell Carbon Nanotubes of 1-nm Diameter", Nature vol. 363, pp. 603-605, Nature Publ'g Grp. (Jun. 17, 1993).

Sun, Yugang, et al., "Uniform Silver Nanowires Synthesis by Reducing AgNO3 with Ethylene Glycol in the Presence of Seeds and Poly (Vinyl Pyrrolidone)", Chem. Mater. vol. 14, No. 11, pp. 4736-4745, American Chem'l Soct'y (Oct. 8, 2002).

Jana, Nikhil R., et al., "Wet Chemical Synthesis of Silver Nanorods and Nanowires of Controllable Aspect Ratio", Chem. Commun. 2001, pp. 617-618, The Royal Soct'y of Chmst'y (2001).

Caswell, K.K., et al., "Seedless, Surfactantless Wet Chemical Synthesis of Silver Nanowires", Nano Lett. vol. 3, No. 5, pp. 667-669, American Chem'l Soct'y (Apr. 22, 2003).

Wang, Zhenghua, et al., "A Simple Hydrothermal Route to Large-scale Synthesis of Uniform Silver Nanowires", Chem. Eur. J., vol. 11, pp. 160-163, Wiley-VCH Verlag GmBH (Nov. 3, 2004).

Sun, Yungang, et al., "Shape-Controlled Synthesis of Gold and Silver Nanoparticles", Science vol. 298, pp. 2176-2179, American Assc'n for the Advmn't of Science (Dec. 13, 2002).

Sun, Yugang, et al., "Large-Scale Synthesis of Uniform Silver Nanowires Through a Soft, Self-Seeding, Polyol Process." Advanced Materials, Jun. 5, 2002, pp. 833-837, vol. No. 14, No. 11, WILEY-VCH Verlag GmbH.

Sun, Yugang, et al., "Crystalline Silver Nanowires by Soft Solution Processing." Nono Letters, 2002, pp. 165-168, vol. 2, No. 2, American Chemical Society.

* cited by examiner

METHOD OF PRODUCING SILVER NANOWIRES IN LARGE QUANTITIES

RELATED APPLICATION(S)

The present Patent Application claims priority to Provisional Patent Application No. 61/457,453 filed Mar. 31, 2011, which is assigned to the assignee hereof and filed by the inventors hereof and which is incorporated by reference herein.

BACKGROUND

1. Field

This disclosure relates to producing silver nanowires. Silver nanowires can be used for electrical conductive membranes, circuit lines, conductive fibers, microelectrodes and sensors.

2. Background

Materials in nano-size exhibit properties remarkably different from their analogous bulk materials, which correlate strongly to their size, shape and morphology. As a result, materials scientists have been focusing on developing simple and effective methods for preparing and fabricating nanomaterials with controllable shapes, sizes and morphology, hence tailoring their properties. As a key material which has been extensively studied in their optical, electrical, thermal and mechanical properties, nano-sized silver has drawn considerable attention from materials scientists. Silver nanowires, which exhibit 1D anisotropy, show great values in various industrial, military, sanitary, and biomedical applications. Thus there is an urgent need in larger scale and lower cost production of them.

SUMMARY

Monodispersed silver nanowires are formed from a solution of a capping agent and polyol. The capping agent is mixed in the polyol to form a substantially homogeneous solution. The solution is elevated to a level below a boiling point of the solution, forming a heated solution. The solution is then diluted with a diluent selected from the materials consisting of water and alcohol, which results in forming the nanowires. The solution is then centrifuged in order to separate the silver nanowires.

DETAILED DESCRIPTION

Overview

Figure 1:
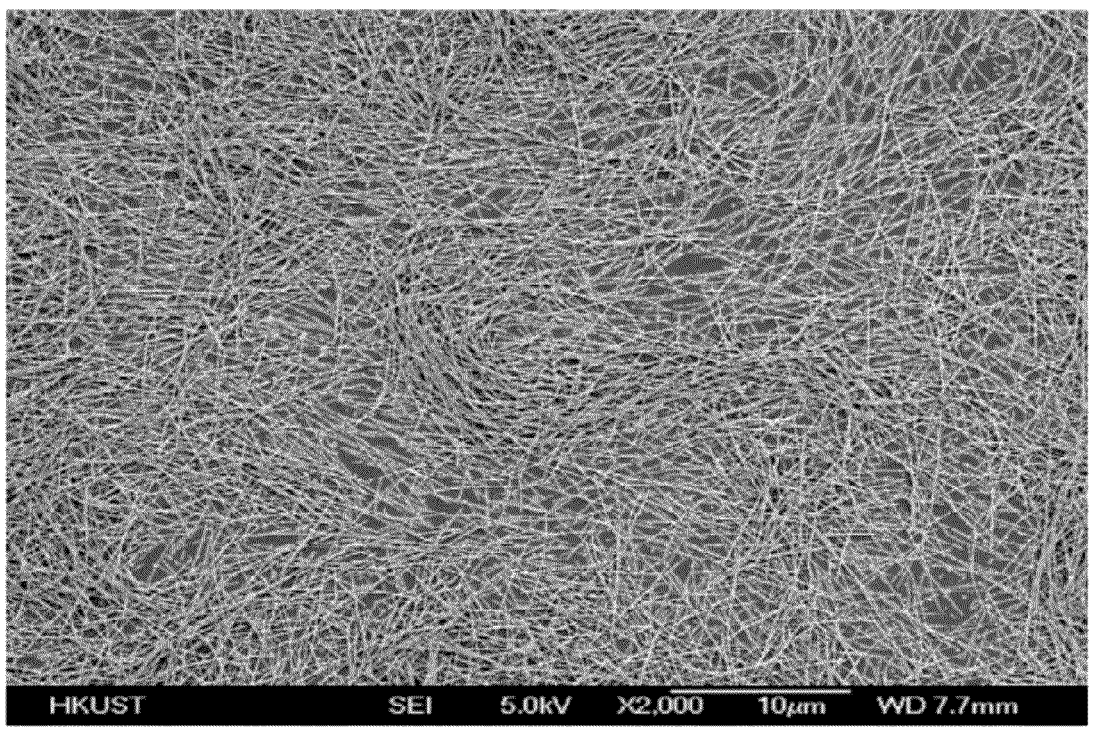
FIG. 1 is a SEM image of a product produced in Example 1.

There are a number of approaches for the preparation of 1D silver nanomaterials (e.g., nanowires). Generally there are two approaches for preparing such nanomaterials—template-directed and template-free. In a template-directed or template-guided technique, the chemical or electrochemical deposition of metal is performed within the channels of macro- or mesoporous membranes. The template-guided method can be routinely repeated with high quality of the products; however, the scale of production is limited by the cost and ability of fabricating such templates. While for the template-free methods, there is no such prohibition. Thus, template-free methods afford more opportunities in practical application. Solution-based template-free synthesis (also referred to as the "polyol" process) is often regarded as an effective way for large-scale production of silver nanowires.

The process involves the reduction of a silver salt by the polyol (e.g., ethylene glycol) in the presence of polyvinylpyrrolidone (PVP). Ethylene glycol serves dual functions as the solvent and the reducing agent, while PVP acts as the surfactant to guide the growth of silver nanowires. The PVP functions as a capping agent to aid stabilizing of nanoparticles.

Typically, the shape and size of the nanostructures formed are affected by parameters including 1) relative amounts of PVP and the metal salt, 2) concentrations of PVP and the metal salt, 3) reaction time, and 4) reaction temperature. The morphology of the nanoparticle seeds generated at the initial state is crucial to the formation of silver nanowires in the subsequent growing process. A mixture of nanostructures of several shapes is often produced in the polyol process, which leads to the problem of poor reproducibility. This usually needs a compensation of tedious centrifugation process to eliminate the byproducts such as silver nanoparticles, which results in higher cost. The nucleation of the silver nanoparticle seeds is affected by a few factors which are still vague; which leads to the formation of quasi-spherical, decahedral, cubooctahedral, and cubic ones etc. The nanoparticles with the multiple-twinned (such as decahedral) structure may lead to the formation of nanowires rather than other crystal structures.

Typically, the reduction is carried out at a temperature near 150° C. in ethylene glycol (boiling point: 197° C.). The polyol process has been modified in efforts to form nanostructures of uniform shapes and sizes. For example, adding trace amounts of chloride to the polyol process created single crystal truncated cubes and tetrahedrons, which suggests an etching effect of the chloride anion. In a non-limiting example, a molar ratio of the chloride salt and the silver salt of between about 0.001 and 0.5 is used. In a non-limiting example, a molar ratio of the water and the reducing gent of between 0.001 and 0.3 is used.

Another technique involving using a seed material (e.g., platinum or silver nanoparticles) in the polyol process generated uniform silver nanowires of high aspect ratio (about 1000).

Additional separation steps are therefore necessary to obtain monodispersed nanostructures. Thus there still remains a need in the art to fabricate nanostructures with controllable shapes and sizes in an effective and reproducible fashion.

According to the present subject matter, silver nanowires are produced with various aspect ratios in a very rapid and efficient way, which can be conveniently scaled up for mass production. Reaction temperature is raised to over 200° C. in several minutes in the high boiling point solvent of glycerol with the presence of trace amount of water. The high reaction temperature leads to high production yield and water assists the ripening process. The water functions as a ripening controlling agent. The nanowires can be used for electrical conductive membranes, circuit lines, conductive fibers, microelectrodes and sensors.

In one example, silver nanowires are prepared in a rapid (within twenty minutes), highly yielded (>90% of nanowires), and morphologically controllable way which deals with gram-level synthesis. The steps includes (a) mixing of silver nitrate, metal chloride (metal cation could be alkali metal cation or alkali earth metal cation or even ammonium cation), and polyvinylpyrrolidone (PVP) in glycerol, (b) adding 0.001%~5% of water, (c) raising the temperature to 210° C. rapidly (in a few minutes), and (d) purifying the silver nanowire product by centrifugation.

It is reported that the silver nanowires can be prepared in a reduction condition that the $Ag^{1+}$ is transformed to $Ag^0$ by polyol (specifically, ethylene glycol). PVP acts as the surfactant to facilitate the growth of Ag nanowire direction.

In the presence of chloride (Cl—) and oxygen, selective etching of the silver seed leads to the preferable twinned nanoparticle structure is obtained. This allows for the control of the growth of silver into one dimension, which is a few microns in length and less than 100 nm in thickness with a narrow distribution. The published Ag nanowire preparation methods are limited to very small quantity, which is due to the difficulty in controlling the dynamic reaction condition. For example, silver nitrate and PVP must be added to the reaction system by using the double channel syringe pump; otherwise the production yield is very low. Since the reaction process is greatly influenced by the local reaction temperature, concentration of the species, and the status of the seeds, it is still a big problem for a larger scale preparation.

In one example, trace amount of water is used here to modulate the growth of silver nanowires as an efficient method for fast and mass production, in the PVP-polyol reaction system. Glycerol is used instead of the widely used ethylene glycol since it has three hydroxyl groups rather than two, which exhibits stronger reducing property to trigger the reduction more easily; it has higher boiling point which allows the reaction temperature reaches a higher limit. Moreover, a trace amount of water is tentatively added to the glycerol solvent. The water molecule plays a subtle, but significant, role in this reaction, which helps to improve the quality of the Ag nanowire product. A very high temperature of 200° C. is used to accelerate the reaction to take place in several minutes, so that this process becomes more practical for mass production. The other advantage of this method is that the yield of the silver nanowires is very high; usually, more than 90% of the reduced products are pure single crystalline nanowires.

In another example, silver nanowires are prepared in controlled structure in a short reaction time and high yield. Two significant features and benefits distinguish the present examples, which are the high reaction temperature and the trace amount of water. As shown in FIG. 1, nanowires are formed in very high uniformity and yield in the presence of silver nitrate, PVP, glycerol, water and sodium chloride.

The method comprises the following steps: firstly, PVP powder and silver nitrate powder are fed into the solution and stirred, which leads to a substantially homogeneous solution. Then a small dose of aqueous metal chloride solution is added to the batch and stirred. Finally, the temperature is raised from room temperature to 210° C. in 1~60 minutes and cooled down. The silver nanowires are obtained when the solution is diluted by alcohol or water and centrifuged. Ethanol and water are preferred solvents because they are safe for human exposure.

In this example, the solvent is glycerol, which has a very high boiling point (290° C.) than other polyols (such as ethylene glycol, propylene glycol etc.), so that the reaction temperature can be raised to over 200° C. without a problem. Glycerol has higher a hydroxyl content ratio since it has three hydroxyl groups. These two features allow glycerol exhibits a higher reducing ability towards silver cation, which leads to a faster reaction velocity. Moreover, glycerol is safe to human health.

It is reported that the presence of a trace amount of chloride and oxygen can improve the selectivity of etching the silver seeds to result in a more twinned nanoparticle structure. This has been accomplished by bubbling air into the hot reaction system to improve the yield of the nanowires based on this scheme. The presence of oxygen is regarded as a key factor to modulate the morphology of silver nanocrystals. This involves oxygen-assisted shape control in polyol synthesis of silver nanocrystals; however, efficient controlled-feeding of oxygen for large reaction batch is a complicated technical problem. Another issue is, because at the elevated temperature, the solubility of oxygen is very weak as compared to oxygen at room temperature. This hinders wider application of the mentioned technique.

In our recent studies, it was observed that water can play a significant role in the etching process of the silver seeds with the presence of metal chloride. At elevated temperature, water is in the form of steam which is dissolved in the glycerol solvent; when the temperature is gradually raised to a relatively high one, the steam inside the solution is in an oversaturated state; it gradually evaporates from the solution as temperature rises. The remaining part in the solution keeps in an oversaturated state. At the elevated temperatures resulting from the increased b.p. of glycerol, both the activity of hydrogen cation and hydroxyl anion is increased. The presence of abundant species, e.g., hydroxyl group and chloride, have strong interaction with silver species and provide an etching effect. This results in the formation of the multiple twinned structures (MTPs). Therefore, it facilitates the formation of silver nanowires. The following examples demonstrate the situation of various reaction conditions:

EXAMPLE 1

FIG. 1 is a SEM image of a product produced in Example 1 200 mL of PVP solution (0.030 g/mL) in glycerol is added in a 500 mL round bottle flask; with tender stirring and heating, 1.58 g silver nitrate powder is added into the solution. Then 59 mg NaCl and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 1. In this image, it can be observed that over 98% of the product is nanowires with the length of about 10μ. Only a very minor part consists of nanoparticles.

EXAMPLE 2

Figure 2:
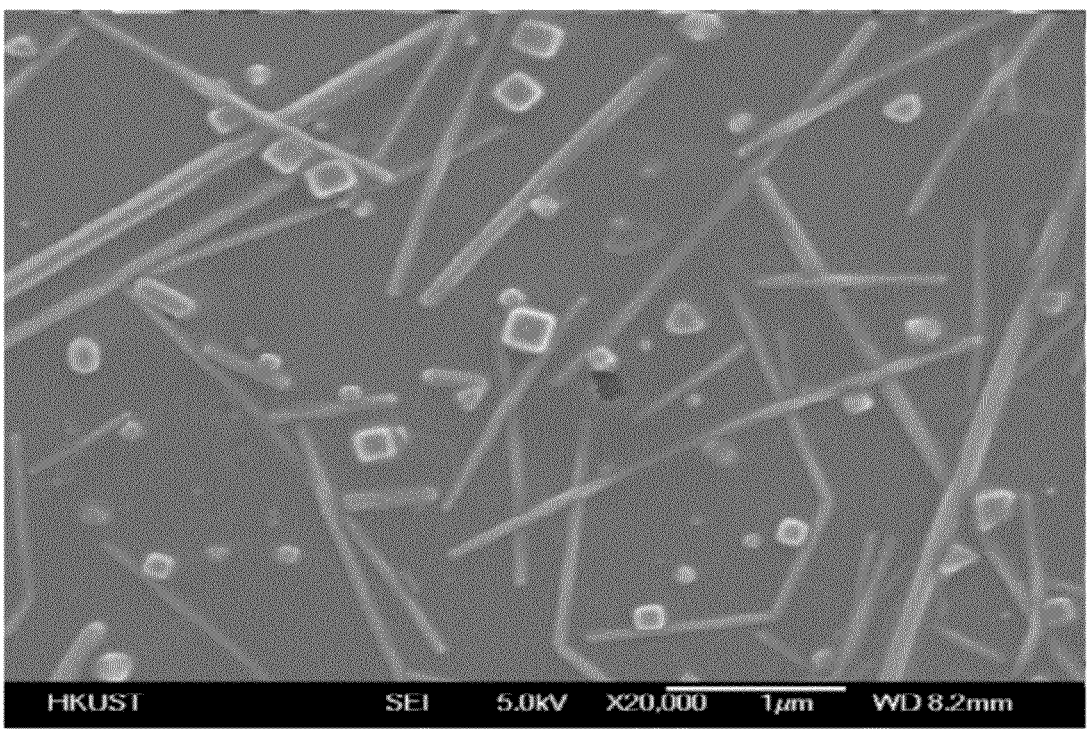
FIG. 2 is a SEM image of a product produced in Example 2.

FIG. 2 is a SEM image of a product produced in Example 2. 200 mL of PVP solution (0.030 g/mL) in glycerol is added in a 500 mL round bottle flask. It is heated in vacuum until 240° C. and kept for one hour to eliminate all water. After the solution is cooled down to room temperature, 1.58 g silver nitrate powder and 59 mg NaCl powder is added into the solution in the protection of nitrogen. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the protection of nitrogen. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 2. In this image it can be observed that there are about 60% of the nanorods with a large range of length from a few hundred of nanometers to a few microns. The other part of the product is cubic nanoparticles.

EXAMPLE 3

Figure 3:
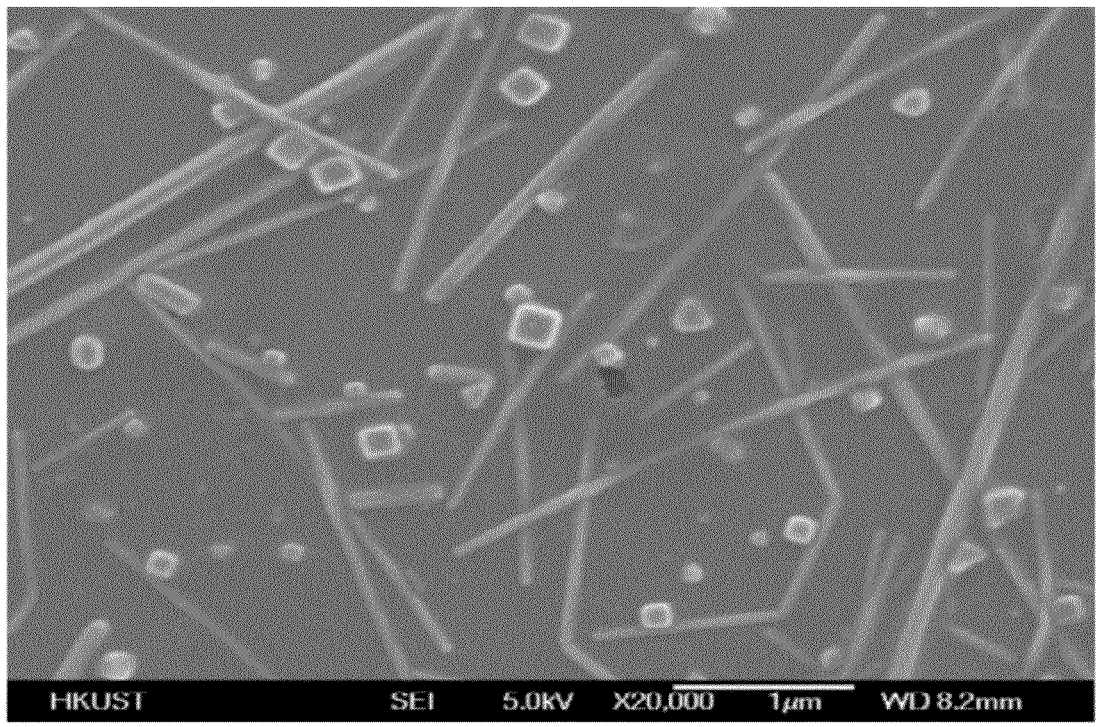
FIG. 3 is a SEM image of a product produced in Example 3.

FIG. 3 is a SEM image of a product produced in Example 3. 200 mL of PVP solution (0.030 g/mL) in glycerol is added in a 500 mL round bottle flask; with tender stirring and heating, 1.58 g silver nitrate powder is added into the solution. Then 43 mg LiCl and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 3. From this figure it can be observed that about 80% of the product are nanorods with the length of about 1.5μ. The other part of the product is nanoparticles including spherical and cubic shapes.

EXAMPLE 4

Figure 4:
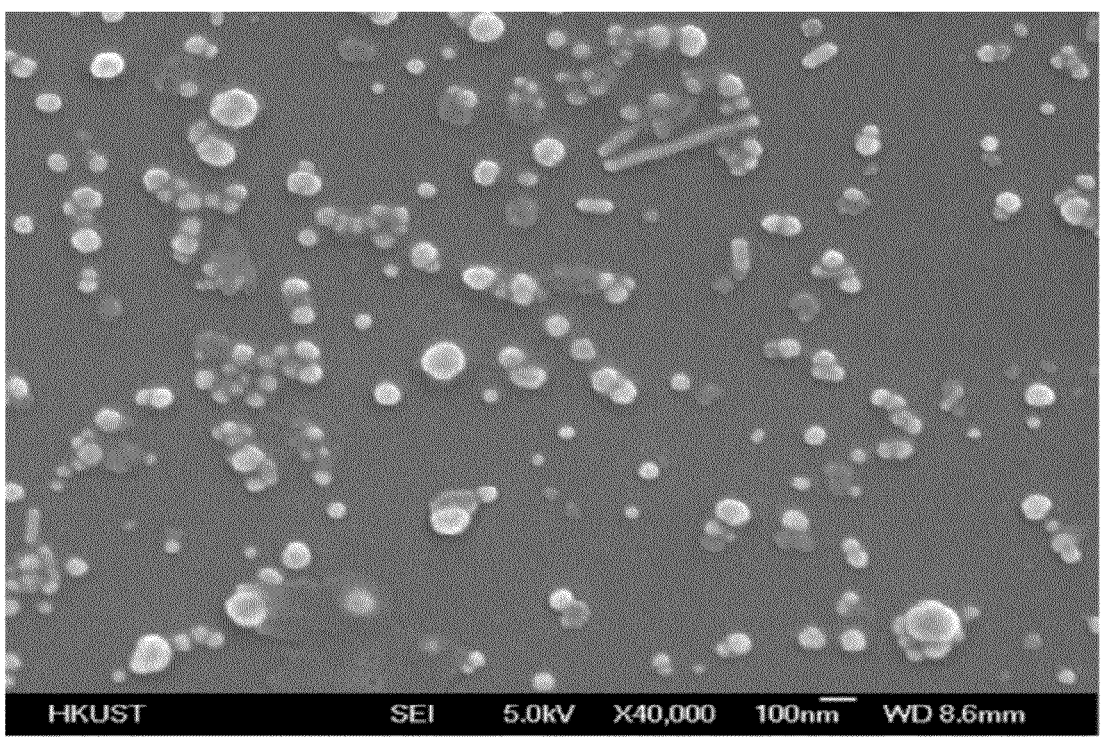
FIG. 4 is a SEM image of a product produced in Example 4.

FIG. 4 is a SEM image of a product produced in Example 4. 200 mL of PVP solution (0.030 g/mL) in glycerol is added in a 500 mL round bottle flask; with tender stirring and heating, 1.58 g silver nitrate powder is added into the solution. Then 42 mg NaF and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 4. Only very minor parts of the product (about 5%) are nanorods; most of the product are nanoparticles.

EXAMPLE 5

Figure 5:
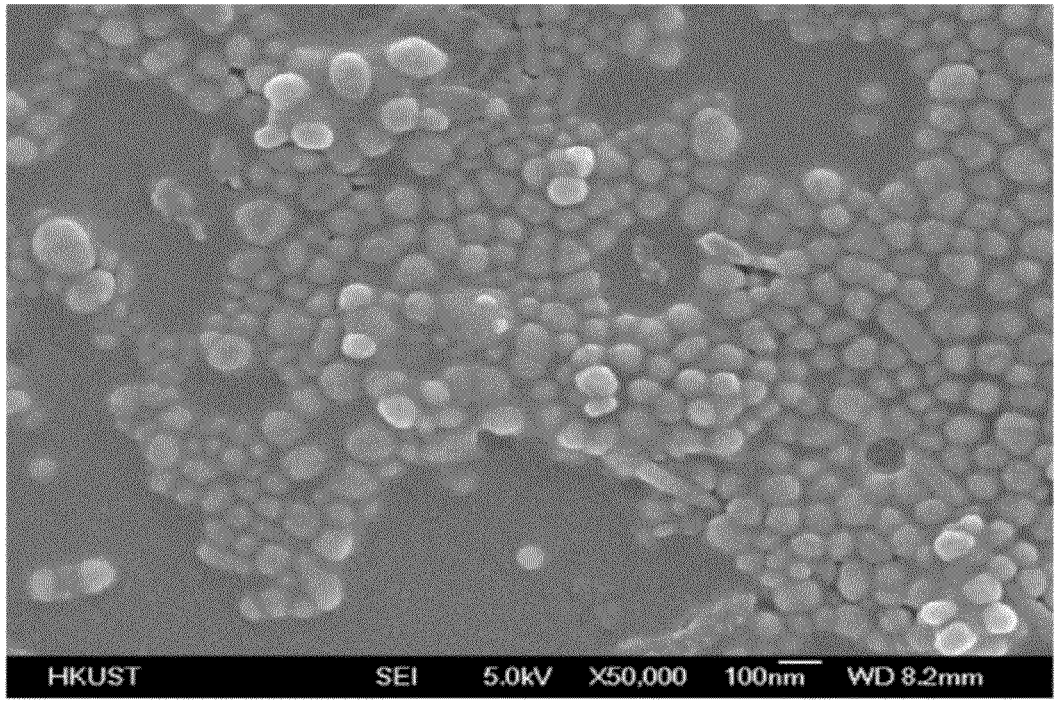
FIG. 5 is a SEM image of a product produced in Example 5.

FIG. 5 is a SEM image of a product produced in Example 5. 200 mL of PVP solution (0.030 g/mL) in glycerol is added in a 500 mL round bottle flask; with tender stirring and heating, 1.58 g silver nitrate powder is added into the solution. Then 118 mg KBr and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 5. Only very rare amount of the silver nanorods are observed; the major part of the product are spherical nanoparticles with the size near 60 nm.

EXAMPLE 6

Figure 6:
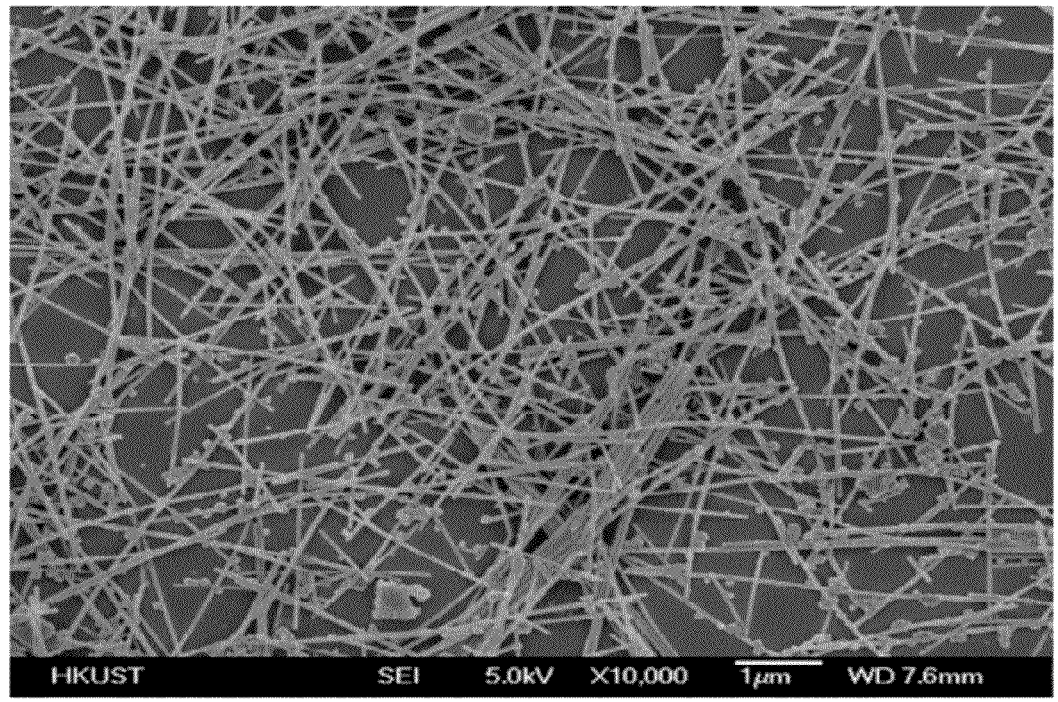
FIG. 6 is a SEM image of a product produced in Example 6.

FIG. 6 is a SEM image of a product produced in Example 6. 200 mL of PVP solution (0.030 g/mL) in glycerol is added in a 500 mL round bottle flask; with tender stirring and heating, 1.58 g silver nitrate powder is added into the solution. Then 166 mg KI and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 6. From thi image it can be observed that about 80% of the product is nanowires with the length ranging from 3μ to 10μ. The other product is the nanoparticles.

EXAMPLE 7

Figure 7:
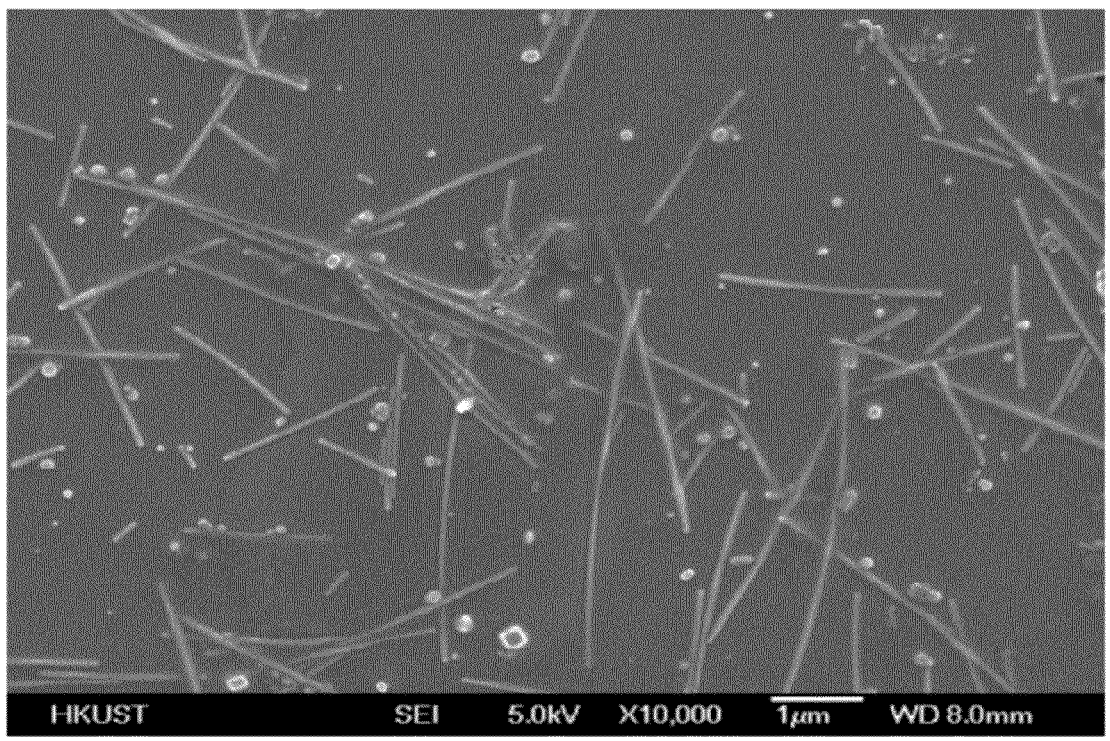
FIG. 7 is a SEM image of a product produced in Example 7.

FIG. 7 is a SEM image of a product produced in Example 7. 200 mL of PVP solution (0.030 g/mL) in glycerol is added in a 500 mL round bottle flask; with tender stirring and heating, 1.58 g silver nitrate powder is added into the solution. Then 48 mg $MgCl_2$ and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 7. From this image it can be observed that about 80% of the product is nanowires with the length about 2µ to 7µ. The other part is nanoparticles.

EXAMPLE 8

Figure 8:
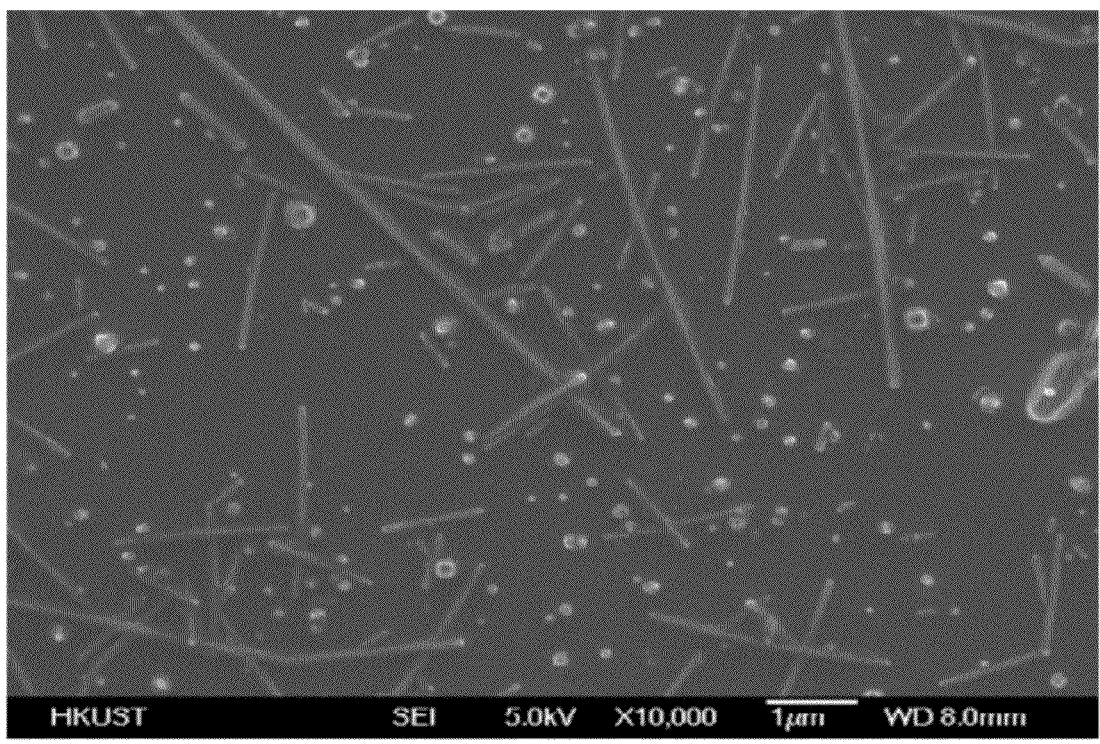
FIG. 8 is a SEM image of a product produced in Example 8.

FIG. 8 is a SEM image of a product produced in Example 8. 200 mL of PVP solution (0.030 g/mL) in glycerol is added in a 500 mL round bottle flask; with tender stirring and heating, 1.58 g silver nitrate powder is added into the solution. Then 53 mg $NH_4Cl$ and 0.5 mL $H_2O$ is added into the flask. After stirring for 5 more minutes at room temperature, the flask is then immersed into a heating mantle equipped with a PTFE paddle stirrer. With gentle stirring (50 rpm), the solution temperature is raised from room temperature to 210° C. in 20 minutes in the air. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 8. From this image it can be observed that there are about 60% of the nanowires with varied length ranging from about 1µ to 10 µ. The other part of the product is nanoparticles.

EXAMPLE 9

Figure 9:
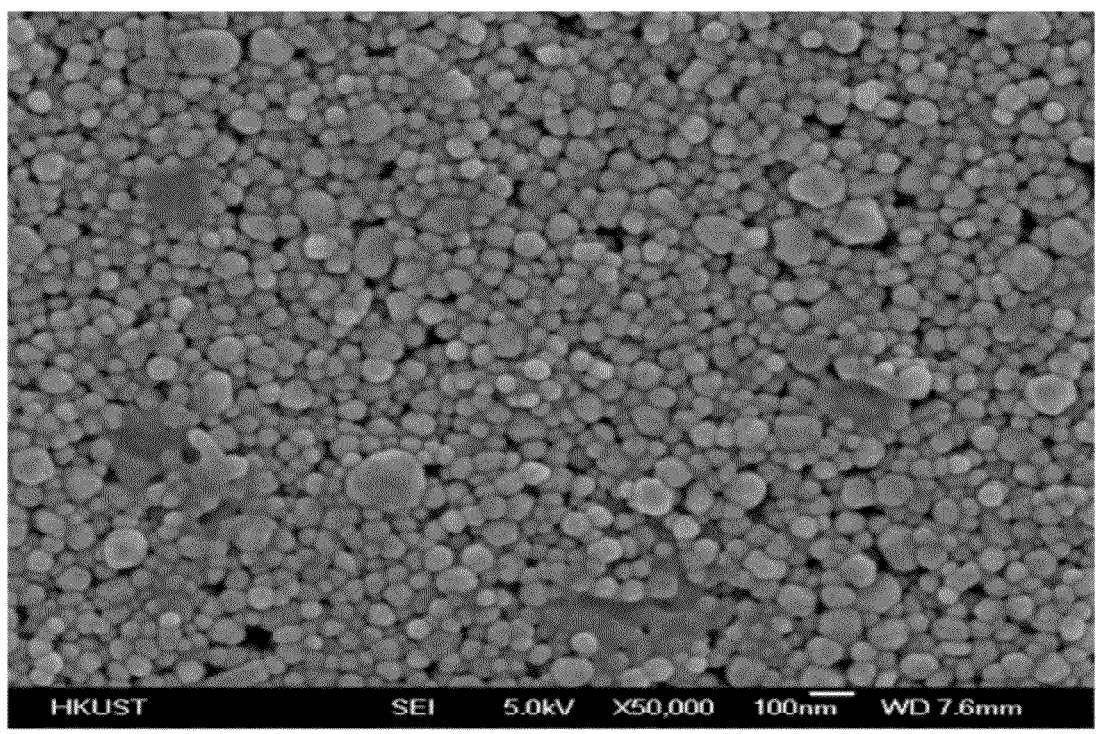
FIG. 9 is a SEM image of a product produced in Example 9.

FIG. 9 is a SEM image of a product produced in Example 9. 200 mL of PVP solution (0.030 g/mL) in glycerol is added in a 500 mL round bottle flask. It is heated in vacuum until 240° C. and kept for one hour to eliminate all water. After the solution is cooled down to room temperature, 1.58 g silver nitrate powder and 59 mg NaCl powder is added into the solution in the protection of nitrogen. After stirring for 5 more minutes at room temperature, the flask is then immersed into a heating mantle equipped with a PTFE paddle stirrer. 0.5 mL ethanol is added into the solution. With gentle stirring (50 rpm), the solution temperature is raised from room temperature to 210° C. in 20 minutes in the protection of nitrogen. The color of the solution turns from pale white into light brown, red, dark gray, and eventually gray-green (near about 200° C.). When the temperature reaches 210° C., the heating is stopped and the temperature drops back to room temperature. Water is added into the solution in 1:1 ratio, and then the mixture is centrifuged at 8000 rpm. The as-obtained Ag nanowires are washed by water for three times to remove the PVP residue. The product is shown in FIG. 9. From this image it can be observed that there are no nanowire in the product. All of the product is nanoparticles with the size ranging from 50 nm to 200 nm.

Absorption Spectra

Figure 10:
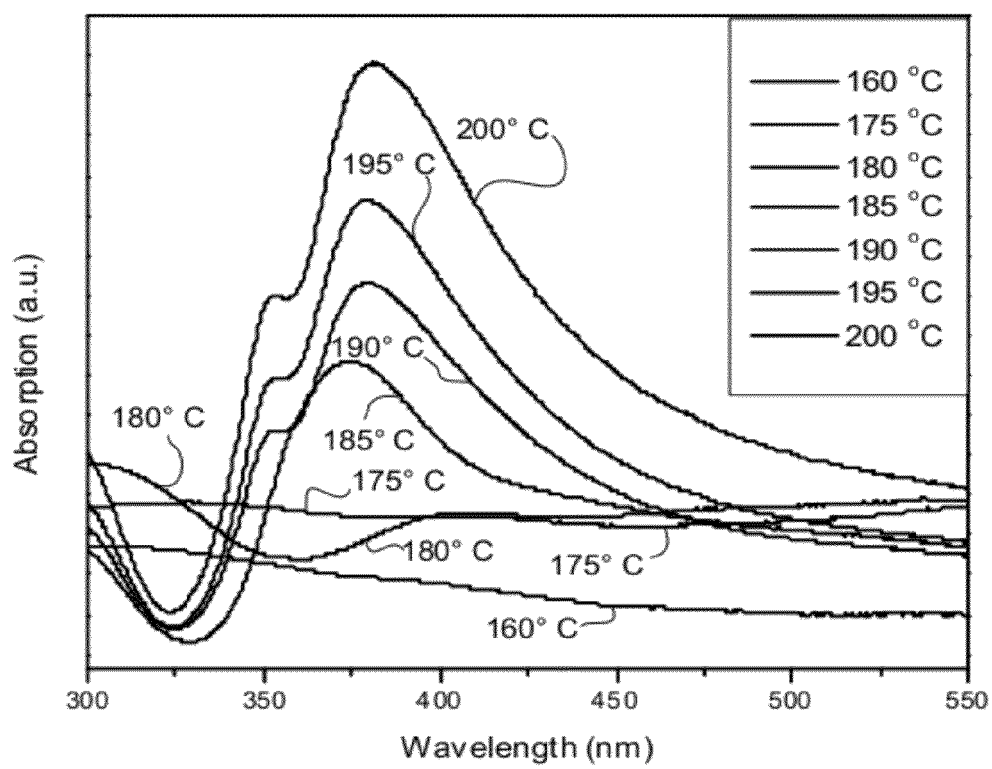
FIG. 10 is a graph of UV light vs. wavelength, showing absorption spectra of the silver nanomaterials at different stages of the reaction in the condition of Example 1.

FIG. 10 is a graph of UV light vs. wavelength, showing absorption spectra of the silver nanomaterials at different stages of the reaction in the condition of Example 1. FIG. 10 demonstrates the variation of the UV-vis absorption spectrum of the Ag nanowires in aqueous solution which was carried out on a Milton 3000 UV-vis spectrophotometer during the preparation process in the condition of Example 1. From this figure, it can be observed that when the temperature is raised to 190° C., peak at 350 nm appears. The peak at 350 nm and 380 nm is attributed to the 1D structure of silver. Further raising the temperature results in the higher peak intensity; on the other hand, there is no significant change of the morphology of the two peaks. Actually, the Ag nanowires start to grow at a relatively high temperature near 190° C., and in a very short period of time (~5 minutes) the reaction is finished, when the temperature reaches 210° C.

Conclusion

In summary, a facile preparation method for large-scale synthesis of high quality silver nanowires has been developed. The characters of this method include that the processing windowing is very board and the reaction condition is simple. This method involves the uses of small dosage of water and metal halides as the catalyst and glycerol as the necessary solvent and reducing agent. Silver nanowires prepared in this way have excellent crystallinity and uniformity. By adjusting the reaction condition, very high yield of the product can be obtained. It is expected that they can be used in many areas including sanitary, clinical diagnosis, catalysis, electrical devices, and military applications.

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method of forming monodispersed silver nanowires comprising:
    mixing a capping agent with a silver salt in a polyol and adding water at a molar ratio of water to a reducing agent of between 0.001 and 0.3 without bubbling air or oxygen into the solution to form a substantially homogeneous solution;
    elevating the temperature of the solution by application of heat using a heating mantle equipped with a stirrer, to a temperature equal to or greater than 210° C. but less than the boiling point of the solution to form a heated solution without bubbling air or oxygen into the solution, thereby reducing dissolved oxygen in the solution;
    allowing the solution to cool to room temperature;
    subsequent to allowing the solution to cool, diluting the solution with a diluent selected from the materials consisting of water and alcohol without bubbling air or oxygen into the solution, thereby forming the nanowires in response to said diluting the solution without the use of controlled-feeding of oxygen to supplement the reaction to provide more than 90% of the reduced products as pure single crystalline nanowires; and
    centrifuging the solution to separate the silver nanowires.

2. The method of claim 1 claim wherein:
    mixing the capping agent in the polyol includes mixing polyvinylpyrrolidone (PVP) powder and silver nitrate powder, feeding the PVP and silver nitrate powder into the polyol to form the homogeneous solution, and adding a trace amount of the aqueous metal chloride solution.

3. The method of claim 2, wherein the elevating the temperature of the solution comprises raising the temperature to between 210° C. and 220° C.;
    and the method further comprises:
    allowing the solution to cool prior to diluting the solution with the diluent.

4. The method of claim 2, further comprising centrifuging the diluted solution at least part of the time of said elevating the temperature of the solution to a level below a boiling point of the polyol.

5. The method of claim 1, further comprising:
the mixing a capping agent in a polyol to form a substantially homogeneous solution comprising adding the capping agent and a chloride salt in a reducing solvent;
forming a reaction solution including a silver salt; and
forming metal nanowires by reducing the silver salt in the reaction solution.

6. The method of claim 5, wherein the reaction solution comprises: a silver salt; a capping agent; a chloride salt, a reducing solvent, and water as a ripening controlling agent.

7. The method of claim 6, wherein the silver salt consists of at least one compound selected from the group consisting of silver nitrate, silver acetate, silver tetraborate, silver trifluoroacetate, or silver perchlorate.

8. The method of claim 6, wherein the chloride salt comprises of at least one compound selected from the group consisting of LiCl, NaCl, KCl, $NH_4Cl$, $CaCl_2$ and $MgCl_2$.

9. The method of claim 6, wherein the capping agent comprises of at least one compound selected from the group consisting of polyvinyl pyrrolidone, polyacrylamide and copolymers thereof.

10. The method of claim 9, wherein the capping agent is polyvinylpyrrolidone (PVP), having a molecular weight within the range of from 1,000 to 5,000,000.

11. The method of claim 6, comprising using glycerol as the reducing solvent.

12. The method of claim 5, further comprising using a molar ratio of the chloride salt and the silver salt of between about 0.001 and 0.5.

13. The method of claim 1, further comprising:
determining the components as solid reactants and liquid solvents;
mixing the solid reactants into the liquid solvents at a first temperature in the range of 20° C. to 150° C.; and
carrying out the reducing reaction at a second temperature of 210° C. to 220° C.

14. The method of claim 1, wherein the reaction solution comprises at least one compound selected from the group consisting of silver nitrate, polyvinylpyrrolidone (PVP), sodium chloride, water and glycerol.

15. The method of claim 1, wherein the capping agent comprises at least one compound selected from the group consisting of polyvinylpyrrolidone (PVP), polyacrylamide and copolymers thereof having a molecular weight of 1,000 to 5,000,000.

16. The method of claim 1, wherein:
mixing the capping agent in the polyol includes mixing polyvinylpyrrolidone (PVP) powder and silver nitrate powder, feeding the PVP and silver nitrate powder into the polyol to form the homogeneous solution, and adding a trace amount of the aqueous metal chloride solution, wherein the elevating the temperature of the solution comprises raising the temperature to between 210° C. and 220° C.;
and the method further comprises:
allowing the solution to cool prior to diluting the solution with the diluent; and
centrifuging the diluted solution at least part of the time of said elevating the temperature of the solution to a level below a boiling point of the polyol.

17. The method of claim 1, wherein
the reaction solution comprises: a silver salt; a capping agent; a chloride salt, a reducing solvent, and water as a ripening controlling agent, and wherein
the silver salt consists of at least one compound selected from the group consisting of silver nitrate, silver acetate, silver tetraborate, silver trifluoroacetate, or silver perchlorate, and wherein
the chloride salt comprises of at least one compound selected from the group consisting of LiCl, NaCl, KCl, $NH_4Cl$, $CaCl_2$ and $MgCl_2$, and wherein the capping agent comprises of at least one compound selected from the group consisting of polyvinyl pyrrolidone, polyacrylamide and copolymers thereof.

18. The method of claim 1, wherein
the reaction solution comprises at least one compound selected from the group consisting of silver nitrate, polyvinylpyrrolidone (PVP), sodium chloride, water and glycerol, and wherein
the capping agent comprises at least one compound selected from the group consisting of polyvinylpyrrolidone (PVP), polyacrylamide and copolymers thereof having a molecular weight of 1,000 to 5,000,000.

* * * * *